United States Patent [19]

Kawana et al.

[11] Patent Number: 4,734,672
[45] Date of Patent: Mar. 29, 1988

[54] VARIABLE RESISTOR CIRCUIT MODULE AND METHOD OF MANUFACTURE

[75] Inventors: Kofu Kawana; Tsutae Okuya, both of Miyagi, Japan

[73] Assignee: Alps Electric Co., Ltd., Japan

[21] Appl. No.: 909,490

[22] Filed: Sep. 19, 1986

[30] Foreign Application Priority Data

Sep. 25, 1985 [JP] Japan ................................ 60-145077

[51] Int. Cl.$^4$ ............................................ H01C 1/012
[52] U.S. Cl. ..................................... 338/312; 338/307
[58] Field of Search .................. 338/61, 62, 371, 306, 338/308, 309, 312; 29/620, 621, 610 R

[56] References Cited

U.S. PATENT DOCUMENTS

| | | | |
|---|---|---|---|
| 3,551,872 | 12/1970 | Emmott et al. | 338/371 X |
| 3,654,580 | 4/1972 | Laisi | 338/61 |
| 4,310,734 | 1/1982 | Yamashita et al. | 200/11 R |

Primary Examiner—E. A. Goldberg
Assistant Examiner—M. M. Lateef

[57] ABSTRACT

A variable resistor circuit module in which a printed substrate having sliding resistor patterns for variable resistor formed by printing a thick organic film and a copper foil printed substrate for mounting electronic parts are prepared separately and laminated with each other by means of insulating hot melt adhesives and electroconductive heat seal connector to thereby electrically connect the copper foil soldering lands with the sliding resistor patterns and the conductive collector patterns.

3 Claims, 2 Drawing Figures

VARIABLE RESISTOR CIRCUIT MODULE AND METHOD OF MANUFACTURE

BACKGROUND OF THE INVENTION

1. Field of the Invention

This invention concerns a variable resistor circuit module.

2. Description of the Prior Art

Variable resistor circuit modules have been prepared so far by forming a sliding resistor pattern for variable resistor by printing a thick organic film on a copper foil printed substrate for mounting electronic parts and by disposing structural parts of the variable resistor capable of sliding on the sliding resistor pattern thereby varying the resistance value.

However, since the processing temperature upon forming the sliding resistor pattern on the copper foil printed substrate by printing a thick organic thick film is higher than 200° C., materials for the printed substrate are restricted only to those capable of withstanding such a high temperature. In addition, since the copper foil pattern on the printed substrate suffers from oxidation during the processing step, surface treatment using expensive noble metal such as gold or silver to the copper foil is necessary for preventing the oxidation which, however, increase the production cost.

Further, since the mounting and soldering of electronic parts are made after forming the sliding resistor pattern, the sliding resistor pattern may suffer from the undesirable effects of heat and flux contamination, etc and soldering of the electronic parts to the printed substrate has therefore been limited only to those restricted means, for example, manual soldering or reflow soldering.

SUMMARY OF THE INVENTION

Accordingly, it is an object of this invention to overcome the foregoing drawbacks in the prior art and provide a variable resistor circuit module requiring no expensive oxidation-preventive surface treatment to the copper foil pattern on the printed circuit substrate for mounting electronic parts, free from undesired effects of heat and flux contamination, etc. to the sliding resistor pattern and capable of using any optional soldering means upon mounting and soldering the electronic parts to the copper foil printed substrate.

The foregoing object can be attained according to this invention by a variable resistor circuit module, wherein a printed substrate having a plurality pairs of sliding patterns for variable resistor and collector patterns arranged side by side formed by printing a thick film substrate and a copper foil printed substrate having copper foil soldering lands for mounting electric parts are disposed separately. Both of the substrates are laminated with each other while disposing insulating hot melt material and electroconductive heat seal connector between both of the substrates to electrically connect the copper foil soldering lands and the sliding resistor patterns and the conductive collector patterns of both of said substrates with each other by means of through holes formed at the terminals for each of the patterns. Mechanical components for a variable resistor are provided which are capable of sliding on the sliding resistor to vary the resistance value thereof on the copper foil printed substrate.

Since the printed substrate formed with sliding resistor patterns for variable resistor by printing a thick organic film and the copper foil printed substrate for mounting the electronic parts are prepared separately, materials for the copper foil printed substrate can optionally be selected with no particular consideration for the processing temperature, no surface treatment using expensive metals is required for the copper foil pattern on the printed substrate, undesired effects due to heat or flux contamination to the sliding resistor patterns can be eliminated and any of optional soldering means can be used upon solding the electronic parts onto copper foil printed substrate to render the soldering work feasible.

DESCRIPTION OF THE ACCOMPANYING DRAWINGS

These and other objects, features, as well as advantageous effects of this invention will become apparent by the following descriptions for the preferred embodiment thereof referring to the accompanying drawings, wherein FIGS. 1 and 2 are explanatory views for this invention, in which FIG. 1 is an exploded perspective view; and FIG. 2 is a cross sectional view showing the step of electrically connecting both of the printed substrates.

DESCRIPTION OF THE PREFERRED EMBODIMENT

Figure 1:
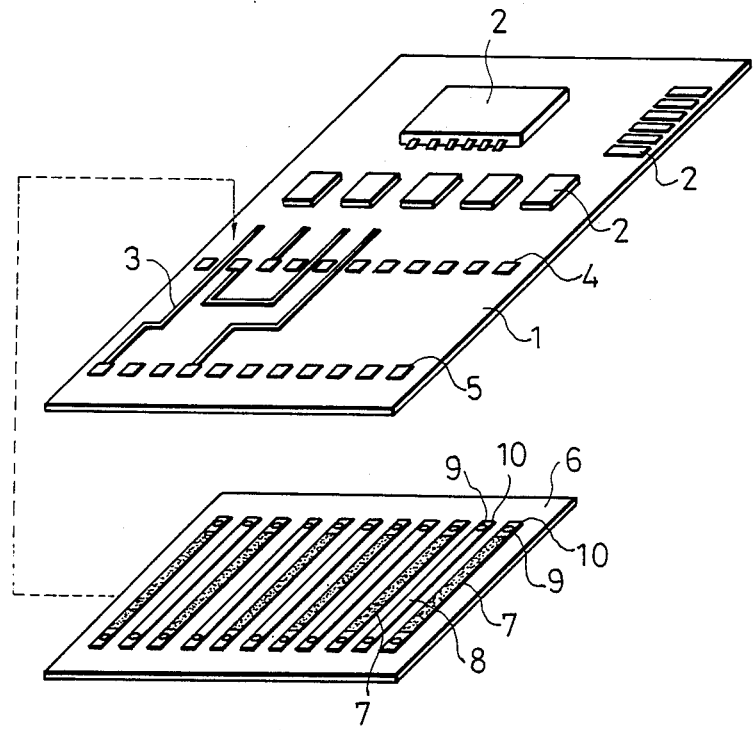

In FIG. 1 explaining this invention, there are shown a copper foil printed substrate 1 made of a phenol resin or the like for mounting electronic parts, electronic parts 2, a copper foil pattern 3, connection lands 4, 5 made of copper foil for connecting both ends of sliding resistor patterns and collector patterns described later. A plurality pair of sliding resistor pattern 7 and collector patterns 8 are formed on the surface of a film-like printed substrate 6, in which the sliding resistor patterns 7 are formed by printing a thick organic film. The printed substrate 6 is made of heat resistant material capable of withstanding the temperature upon forming the sliding resistor pattern 7 by printing the thick organic film. Through holes 9 are formed by printing an electroconductive paint to the holes formed in the terminals 10 on both ends of the sliding resistor patterns 7 and the collector patterns 8. Then, as shown in FIG. 2, both of the printed substrates 1, 6 are connected electrically by placing electroconductive heat seal connector 11 on the connecting lands 4, 5 on the printed substrate 1, placing securing hot melt adhesives 12 between both of the connecting lands 4, 5 and between both of the printed substrates 1, 6 and further placing thereover the printed substrate 6 such that the sliding resistor patterns 7 lie on the upper surface and applying heating to melt the heat seal connector 11 and the hot melt adhesives 12 thereby electrically conducting the connecting lands 4, 5 of the printed substrate 1 with the sliding resistor patterns 7 and the collector patterns 7 on the printed substrate 6.

Figure 2:
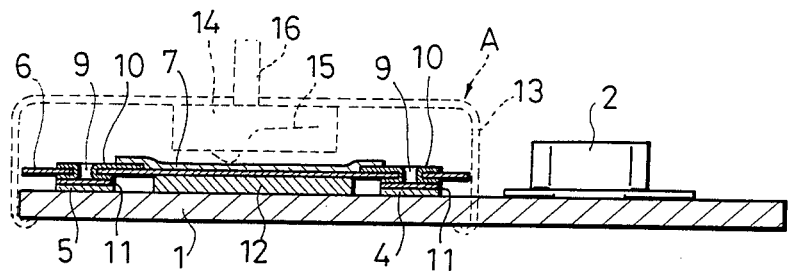

A frame 13, a slider receptacle 14, a slider 15, and a lever 16 depicted by the dotted lines in FIG. 2 constitute a mechanical component A for the variable resistor, which is adapted such that the slider 15 is caused to slide on the sliding resistor patterns 7 and the collector patterns 8 by the movement of the lever 16 to thereby vary the resistance value.

In the embodiment according to this invention having the foregoing structure, the sliding resistor patterns 7 are formed on the printed substrate 6 by printing a thick organic film separately from the copper foil printed substrate 1 for mounting the electronic parts and, accordingly, the printed substrate 1 does not suffer from the processing temperature higher than 200° C. required for forming the sliding resistor pattern 7 on the printed substate 1 by printing the thick film. Therefore, the materials for the printed substrate 1 can be selected optionally with no particular consideration for the processing temperature. Further, expensive surface treatment using noble metal to the copper foil pattern 3 of the printed substrate 1 is no more required for the prevention of oxidation and the production cost can be reduced.

Furthermore, the sliding resistor patterns 7 are not formed on the printed substrate 1 and, accordingly, there is no worry for the undesired effects of heat and flux contamination, etc. to the sliding resistor patterns 7 upon mounting or soldering the electronic parts on the printed substrate 1. Accordingly, any of optional soldering means can be employed to render the soldering work feasible.

Furthermore, the printed substrate 6 is made of a flexible film, which is laminated to integrate with a portion of the printed substrate 1 and, accordingly, the entire thickness of the substrates can be maintained approximately to the same extent of thickness as in the conventional case where the sliding resistor patterns 7 are directly formed on the printed substrate 1.

According to this invention as described above, since the printed substrate formed with the sliding resistor patterns for variable resistor by printing a thick organic film and the copper foil printed substrate for mounting the electronic parts are prepared separately, a processing temperature higher than 200° C. required upon forming the sliding resistor patterns by printing a thick organic film is not applied to the printed substrate for mounting the electronic part. Accordingly, the materials for the printed substrate can optionally be selected with no particular consideration for the processing temperature. Further, since no processing step is applied to the copper foil printed substrate, the copper foil thereon is free from oxidation and thus requires no surface treatment using expensive metals for the prevention of oxidation. Accordingly, the production cost can be reduced as compared with the usual case. Furthermore, since there is no worry for the heat or flux contaminations to the sliding resistor patterns upon soldering the electronic parts onto the printed substrate, any of optional soldering means can be used to render the soldering work feasible.

What is claimed is:

1. A method for manufacturing a variable resistor circut module comprising the steps of: printing a thick organic film first substrate having pairs of resistor patterns for varying resistance and conductive collector patterns arranged side by side, preparing separately a copper foil second printed substrate having copper foil soldering lands for mounting electric parts, laminating said first and second substrates together with insulating hot melt material and an electroconductive heat seal connector to electrically connect said copper foil soldering lands, said sliding resistor patterns, and said conductive collector patterns of said substrates by means of through holes formed at terminals in the sliding resistor and conductive collector patterns, and arranging mechanical component means on the variable resistor circuit module for sliding movement thereon to vary the resistance value on the second printed substrate.

2. A method for manufacturing a variable resistor circuit module according to claim 1, wherein the electroconductive heat seal connector is disposed on the solder connecting lands on the second printed substrate, the securing insulation hot melt materials are disposed between both of the connecting lands and between the first and second printed substrates, the first printed substrate is placed over the second substrate such that said resistor resistor patterns lie on an upper surface, and said electroconductive heat seal connector and said insulating hot melt materials are melted, thereby electrically connecting the connecting lands on the second printed substrate with the sliding resistor patterns and the collector patterns on the first printed substrate.

3. A variable resistor circuit module, comprising:
a first printed substrate made of a flexible, heat resistant film like material having pairs of resistor patterns and conductive collector patterns arranged side by side on an upper surface thereof, said resistor patterns and said collector patterns being formed by printing a thick organic film at relatively high process temperatures, said patterns having terminals at respective both ends thereof formed by holes through said first substrate and printing with an electroconductive paint on upper and lower surfaces of said first substrate around said through holes,
a second printed substrate, separately formed from said first printed substrate, having copper foil patterns formed thereon at relatively low process temperatures, including copper foil soldering lands positioned correspondingly to said pattern terminals of said first printed substrate, wherein said patterns of said first and second printed substrates are connected electrically by electroconductive heat seal connector layers applied between said copper foil soldering lands of said second printed substrates and said electroconductive paint around said through holes on the lower surface of said first printed substrate, and said first and second substrates are laminated together by a layer of insulating hot melt material applied therebetween; and
mechanical component means arranged on the variable resistor circuit module for sliding movement thereon in contact with said sliding and collector patterns.

* * * * *